United States Patent [19]

Hirsch et al.

[11] Patent Number: 4,981,715

[45] Date of Patent: Jan. 1, 1991

[54] METHOD OF PATTERNING ELECTROLESS PLATED METAL ON A POLYMER SUBSTRATE

[75] Inventors: Tom J. Hirsch; Charles W. C. Lin, both of Austin, Tex.

[73] Assignee: Microelectronics and Computer Technology Corporation, Austin, Tex.

[21] Appl. No.: 494,897

[22] Filed: Mar. 13, 1990

Related U.S. Application Data

[63] Continuation-in-part of Ser. No. 393,170, Aug. 10, 1989, abandoned.

[51] Int. Cl.$^5$ .............................................. B03D 3/06
[52] U.S. Cl. ................................... 427/53.1; 156/628; 427/48
[58] Field of Search ................. 427/53.1, 98; 156/628, 156/654, 656

[56] References Cited

U.S. PATENT DOCUMENTS

| | | | |
|---|---|---|---|
| 4,078,096 | 3/1978 | Redmond et al. | 427/98 |
| 4,112,139 | 9/1978 | Shirk et al. | 427/54 |
| 4,388,351 | 6/1983 | Sawyer | 427/304 |
| 4,472,513 | 9/1984 | Menger-Hammond et al. | 502/5 |
| 4,486,463 | 12/1984 | Rubner et al. | 427/53.1 |
| 4,517,254 | 5/1985 | Grapentin et al. | 428/626 |
| 4,519,876 | 5/1985 | Lee et al. | 204/15 |
| 4,574,095 | 3/1986 | Baum et al. | 427/53.1 |
| 4,643,798 | 2/1987 | Takadei et al. | 427/98 |
| 4,659,587 | 4/1987 | Imura | 427/98 |
| 4,666,735 | 5/1987 | Hoover et al. | 427/43.1 |
| 4,670,306 | 6/1987 | Salem | 427/258 |
| 4,681,774 | 7/1987 | Halliwell et al. | 427/53.1 |
| 4,701,351 | 10/1987 | Jackson | 427/98 |
| 4,775,608 | 10/1988 | Baum et al. | 430/320 |

OTHER PUBLICATIONS

Auerbach, "Method for Reducing Metal Salts Complexed in a Polymer Host with a Laser," Journal of the Electrochemical Society:Solid-State Science Technology, pp. 1437–1440, vol. 132, No. 6, Jun. 1985.
Gross et al, "Laser Direct-Write Metallization in Thin Palladium Acetate Films," Journal of Applied Physics, pp. 1628–1632, vol. 61 (4), Feb. 1987.
Gupta et al., "High-Conductance Customized Copper Interconnections Produced by Laser Seeding and Selective Electrodeposition," Applied Physics Letter, pp. 2515–2518, vol. 56(25), Jun. 1990.
Cole et al., "Laser Processing for Interconnect Technology," Optoelectronics and Laser Applications in Science and Engineering, Jan. 1988, pp. A4–2 through A4–6.
"Deposit Copper Films on Polyimide Using a Laser Catalysed Process", Semiconductor International, Nov. 1988, p. 16.
Jackson, "Initiation of Electroless Copper Plating Using Pd(+2)/Poly(Acrylic Acid) Films," Journal of Electrochemical Society, Dec. 1988, pp. 3172–3173.
Von Gutfeld et al., "Laser-Enhanced Plating and Etching: Mechanisms and Applications," IBM Journal of Research and Development, vol. 26, No. 2, Mar. 1982, pp. 136–144.
Cole et al., "Laser-Activated Copper Deposition on Polyimide," Electrochemical Society Meeting, Symposium on Electronic Packaging, Oct. 1987, pp. A4–7 through A4–12.

*Primary Examiner*—Stanley Silverman
*Attorney, Agent, or Firm*—David M. Sigmond

[57] ABSTRACT

A method is described for patterning electroless plated metal on a polymer substrate. A substrate is first coated with a polymer suitable for complexing noble metal compounds. The substrate is then complexed with a noble metal compound, such as containing palladium, selectively irradiated to form the desired conductor pattern, and then etched so that the desired pattern remains. The substrate is subsequently placed in an electroless plating bath to form a metal pattern. Alternatively, before applying the noble metal compound, a substrate immersed in a polymer solution suitable for complexing a noble metal compound can be selectively irradiated to selectively deposit polymer on the substrate, followed by applying a noble metal compound and an electroless plating bath.

34 Claims, No Drawings

METHOD OF PATTERNING ELECTROLESS PLATED METAL ON A POLYMER SUBSTRATE

The U.S. Government has a paid-up license in this invention and the right in limited circumstances to require the patent owner to license others on reasonable terms as provided for by the Defense Advanced Research Projects Agency (DARPA).

CROSS-REFERENCE TO RELATED APPLICATIONS

This is a continuation-in-part of U.S. application Ser. No. 07/393,170, filed on Aug. 10, 1989, now abandoned.

BACKGROUND OF THE INVENTION

The present invention relates to the field of selective deposition of thin film metallization on a substrate for microelectronic interconnects. Laser assisted electroless plating has been discussed in the literature in which a laser beam is used to enhance the plating reactions by creating very localized heating. These methods suffer the drawback that the horizontal scan rate of the laser is constrained by the slow vertical electroless deposition rates. These slow vertical deposition rates are inherent in the physics of the process and are not likely to be increased substantially. This time delay may make direct laser write of plated metal impractical when hundreds or thousands of interconnections must be formed on a substrate.

Another technique for patterning metal on a substrate is by laser assisted chemical vapor deposition of a palladium catalyst, as disclosed in Baum U.S. Pat. No. 4,574,095. This method, however, uses a temperature controlled vacuum system during laser writing which requires a much more complex and expensive process than wet chemistry.

It is also well known that a polymer film which does not initially contain palladium can be patterned, and palladium can be subsequently applied to the patterned film to form a catalyst for electroless plating, as described in Hoover U.S. Pat. No. 4,666,735 and Jackson U.S. Pat. No. 4,701,351. In both of these methods, however, conventional photolithography techniques are used to pattern the polymer film; that is, a photoimagible polymer is exposed to light through a mask to create the desired pattern. In the case of the method in Jackson this photoimagible polymer is separate from the polymer which complexes the palladium.

Finally, in a paper by Cole, et. al. presented at the Electrochemical Society Meeting in October, 1987 a method is proposed in which palladium compounds are irradiated with a laser to selectively physically alter the palladium in such a way that only the irradiated areas are catalytic to electroless plating. One drawback of this method is that the film must cover the entire substrate prior to laser writing and therefore most of the palladium, an expensive material, may be wasted since in some applications only a small percentage of the substrate area will ultimately contain metal features.

SUMMARY

It is an object of the present invention to provide an improved method of patterning electroless plated metal on a polymer substrate.

Yet a further object of the present invention is a method of forming a pattern of electroless plated metal using an irradiation SOurce to pattern a polymer that is not constrained by the slow vertical electroless deposition rates of the metal to be plated.

A still further object of the present invention is a method of patterning electroless metal to customize or repair existing metallization that does not require the use of photolithography.

Yet another object of the present invention is a method of patterning electroless interconnections or bond pads that encompasses a wide range of metals to be plated.

Yet a still further object of the present invention is wherein a pattern can be formed by irradiation of the polymer, with or without the presence of palladium in the polymer, prior to electroless plating.

A still further object of the present invention is wherein an irradiated pattern of polymer can be deposited on the substrate prior to contact with the noble metal compound in order to make economic use of the noble metal compound.

Yet a still further object of the present invention is to provide a wet chemistry invention that is relatively simple and inexpensive.

In accordance with one aspect of the present invention, a substrate is coated with a polymer that binds tightly to the substrate. The polymer is then contacted with a seeding noble metal compound, such as containing palladium. The complexed polymer is then irradiated with a laser beam in a desired pattern. The substrate is then placed in a wet chemical etch to remove the non-irradiated regions. Finally, the substrate is exposed to a conventional electroless plating bath which results in a metal pattern that adheres well to the substrate.

In accordance with another aspect of the present invention, a substrate is coated with a mixture of a polymer that binds tightly to the substrate and a seeding noble metal compound, wherein the mixture forms a complexed polymer. The complexed polymer is then irradiated with a laser beam in a desired pattern. The substrate is then placed in a wet chemical etch to remove the non-irradiated regions. Finally, the substrate is exposed to a conventional electroless plating bath which results in a metal pattern that adheres well to the substrate.

In accordance with another aspect of the present invention, there is provided another method for preparing an electroless plated metal pattern. A substrate is immersed in a uncomplexed polymer solution and then the polymer is deposited on the substrate in those regions that are selectively irradiated. The substrate with the deposited pattern of polymer is then removed from the polymer solution and rinsed with deionized water to remove excess solution. Thereafter a noble metal compound is applied to the patterned polymer and then the substrate is exposed to a conventional electroless plating bath.

These and other objects, features and advantages of the present invention will be more readily apparent from a review of the detailed description and preferred embodiments which follow.

DETAILED DESCRIPTION OF THE PREFERRED EMBODIMENTS

In performing the method of the present invention, preferably the top surface of the substrate will be clean prior to the coating of the polymer layer to ensure good adhesion of the plated metal to the substrate. One such cleaning technique, for example, consists of exposing the substrate surface to an argon plasma in a vacuum chamber for 2.5 kW-minutes.

The substrate is next coated with a polymer which complexes with a noble metal compound. Such polymers include poly(acrylic acid) and polyacrylamid. The polymer layer can be applied by numerous teChniques, such as dip coating, spray coating, spin coating or plasma deposition. In any case the polymer solution is dried to form a residual film. Preferably the substrate is coated with poly(acrylic acid), for example by placing a thin layer (approximately 1 millimeter) of 1% by weight aqueous poly(acrylic acid) onto a substrate and allowing the solution to dry in air while the substrate lies flat. After the solution has dried, typically in 15 to 30 minutes, a layer of poly(acrylic acid) approximately 1.5 microns thick remains on the substrate.

The next step is to contact the polymer layer with a liquid solution containing ions of an appropriate catalyst, such as a noble metal compound, so that the polymer will incorporate these ions and be catalytic for subsequent electroless plating of metal. Preferred noble metal compounds contain palladium, such as palladium (II) chloride, palladium (II) sulfate, or palladium acetylacetonate. The noble metal compound can be applied by numerous techniques, such as dip coating, spray coating from a solution of the noble metal compound or by exposure of the substrate to the vapor of the compound. Following this treatment the substrate is preferably rinsed and dried. In the preferred embodiment 0.1 M aqueous palladium sulfate solution is applied to the polymer-coated substrate for 3 minutes, followed by rinsing the substrate with deionized water for 20 seconds, and drying the substrate with pressurized nitrogen.

The use of a substrate coated with a polymer layer and a noble metal compound is well known in the art, see, e.g., Jackson U.S. Pat. No. 4,701,351, entitled "Seeding Process for Electroless Metal Deposition."

The complexed polymer is next selectively irradiated so that those regions exposed to localized heating will etch at a slower rate than the non-exposed regions during a subsequent chemical etch. While the preferred energy source is a continuous wave argon laser, numerous other sources of irradiation can be used, such as a frequency doubled Nd:YAG, krypton, or dye lasers, and conceivably particle beams or electron beams as well. In the preferred embodiment an argon laser selectively irradiates those regions where the metal interconnect pattern is desired. For instance, a continuous wave argon laser in the all lines mode can be used with 0.025 W beam power incident on the substrate, focused to form a gaussian-profile spot with 1/(e-squared) radius of 15 microns. A computer controlled X-Y stage can be used to scan the substrate relative to the fixed laser beam at a speed of 100 microns per second, for example, and thus apply a desired pattern of irradiation to the substrate.

After irradiation the substrate is exposed to a suitable chemical etchant in order to etch the irradiated regions at a slower rate than the non-irradiated regions. In the preferred embodiment the substrate is etched until the non-irradiated complexed polymer is removed, while little or none of the irradiated portions are etched. This can be accomplished, for example, by immersing the substrate in 1 M NaOH (sodium hydroxide) for a time appropriate to the thickness of the polymer film, for instance 2 minutes for a 1.5 micron thick film. Another suitable etchant is KOH (potassium hydroxide). The substrate is then rinsed with deionized water for 30 seconds.

In the final step the substrate is exposed to a conventional electroless plating bath in order to deposit the metal in correspondence with the patterned complexed polymer. Upon completion of the electroless bath the desired metal interconnects and/or bond pads will adhere tightly to the substrate in the regions where the complexed polymer remained. The plating bath can be operated in the conventional manner, for instance, by having the bath heated to an appropriate temperature and agitated by mechanical stirring. While copper is the preferred metal to be plated, other suitable metals can be used, for instance nickel or gold. In the preferred embodiment the electroless bath consists of Shipley "CUPOSIT 385" (trademark) with an immersion time of at least 10 minutes.

Alternatively, if desired, instead of coating the substrate with a polymer and then contacting the polymer with a noble metal compound in a two-step process, a one-step process can be used in which the substrate is coated with a polymer-noble metal compound mixture in a single step. The polymer-noble metal compound mixture forms a complexed polymer, so the one-step process could also be described as coating the substrate with a complexed polymer in a single step. The one-step process is the same as the two-step process in all other respects and the same results are achieved.

In an alternative embodiment of the present invention, the substrate can be immersed in a polymer solution that complexes with a noble metal compound, and then selectively irradiated before it is contacted with the noble metal compound. When irradiating with a focused laser beam, a bubble is generated in the solution at the focal spot. The polymer will then be deposited on the substrate in a thin film only where the localized heating and subsequent bubble occur. The substrate is then removed from the polymer solution and cleaned so that the remaining polymer forms a pattern where it was deposited by the local heating. Thereafter the patterned polymer is contacted with a noble metal compound so that the pattern becomes catalytic to a subsequent electroless bath. One advantage of this embodiment is that the etching step is eliminated. Another advantage is that the noble metal compound is absorbed only where the polymer is deposited by irradiation and the electroless bath metal is eventually plated. This economic use of the noble metal compound is especially important in the case of palladium, which is quite expensive.

In this embodiment, a preferred method is to immerse the substrate in poly(acrylic acid) solution and then selectively irradiate the immersed substrate with a continuous wave argon laser similar to that used in the previous embodiment. Those regions of the substrate where the irradiation causes localized heating will cause a thin film of the polymer from the solution to be selectively deposited. After completion of the irradiation the substrate is removed from the poly(acrylic acid) solution, and the residual polymer solution is removed, for instance, by rinsing with deionized water for 30 seconds. Then the deposited patterned polymer is contacted with 0.1 M palladium sulfate for 3 minutes, and then the substrate is rinsed again in deionized water for 30 seconds. Finally, the complexed polymer is exposed to a conventional electroless plating bath to form the desired metallization pattern corresponding to the complexed polymer.

Applicant has not currently reduced to practice the one-step polymer-noble metal compound coating for this second embodiment; however, the one-step polymer-noble metal compound coating has been successfully reduced to practice for the first embodiment as previously described.

The present invention will be illustrated further by the following examples. These examples are meant to illustrate and not to limit the invention, the scope of which is defined solely by the appended claims.

EXAMPLE 1

A multi-chip packaging substrate, consisting of a silicon wafer coated with several layers of polyimide (total thickness approximately 30 microns) and copper features prepatterned by conventional methods, was cleaned in an oxygen plasma for 2.5 kW-minutes. The substrate was then covered with a 1 millimeter thick liquid film of 1% aqueous poly(acrylic acid) (molecular weight 250,000) and subsequently allowed to dry in a horizontal position in air for 1 hour. A solid layer of poly (acrylic acid) approximately 1.5 microns thick formed on the substrate. Next the substrate was covered with 0.1 M palladium sulfate for 3 minutes, then rinsed with deionized water for 20 seconds and then dried with pressurized nitrogen at room temperature for 10 seconds. The substrate was then irradiated in various patterns at a horizontal scan rate of 100 microns per second with a focused continuous-wave argon laser in all-lines mode with an incident beam power of 0.025 W and a 1/(e squared) beam radius of approximately 15 microns. The irradiated areas had complexed poly(acrylic acid) over both the polyimide and the copper features on the polyimide. The patterns were mostly configured to connect the previously isolated copper features. The substrate was next etched in 1 M aqueous NaOH at room temperature for 2 minutes and then rinsed with deionized water for 30 seconds. Finally the substrate was exposed to a Shipley "CUPOSIT 385" (trademark) copper electroless plating bath for 10 minutes, operated at 30 degrees C. with mechanical stirring. A copper pattern corresponding to the irradiated regions adhered tightly to the substrate.

EXAMPLE 2

A multi-chip packaging substrate similar to that in example 1 was cleaned in an argon plasma for 2.5 kW-minutes. The substrate was then immersed in 2% poly(acrylic acid) (molecular weight 250,000) in glycerol. Next the immersed substrate was irradiated in a crossed-line pattern at a horizontal scan rate of 100 microns per second with a focused continuous-wave argon laser in all-lines mode with an incident beam power of 0.025 W and a 1/(e squared) beam radius of approximately 15 microns. The substrate containing patterned polymer was then removed from the poly(acrylic acid) and rinsed with deionized water for 30 seconds, and then covered with 0.1 M palladium sulfate for 3 minutes, and then rinsed again with deionized water for 20 seconds. Finally the substrate was exposed to a Shipley "NIPOSIT 468" (trademark) nickel electroless plating bath operated at 66 degrees C. with mechanical stirring for 9 minutes. The desired nickel pattern adhered tightly to the substrate.

The present invention is therefore well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What I claim is:

1. A process for the selective deposition of a conductor on a substrate comprising the following steps in the sequence set forth:
    (a) coating the substrate with a layer of a polymer which can complex with a noble metal compound,
    (b) contacting the layer of polymer with a noble metal compound to form a complexed polymer,
    (c) drying the complexed polymer,
    (d) selectively irradiating the complexed polymer in a predetermined pattern,
    (e) applying a chemical etch to the complexed polymer so that the irradiated portions of the complexed polymer etch at a slower rate than the non-irradiated portions of the complexed polymer,
    (f) removing the chemical etch and the etched complexed polymer from the substrate wherein the complexed polymer remaining on the substrate corresponds to the predetermined pattern, and
    (g) placing the complexed polymer remaining on the substrate in an electroless plating bath so that the desired conductor pattern is formed in the predetermined pattern.

2. The process in claim 1 wherein prior to step (a) the substrate surface is cleaned.

3. The process in claim 1 wherein the polymer is selected from the group consisting of poly (acrylic acid) and polyacrylamid.

4. The process in claim 1 wherein the noble metal compound is selected from the group consisting of palladium (II) chloride, palladium (II) sulfate, and palladium (II) acetylacetonate.

5. The process in claim 1 wherein the source of irradiation is a laser beam.

6. The process in claim 1 wherein the etchant is selected from the group consisting of KOH and HaOH.

7. The process in claim 1 wherein the electroless plating bath is used to plate a metal selected from the group consisting of copper, nickel, and gold.

8. A process for the selective deposition of a conductor on a substrate comprising the following steps in the sequence set forth:
    (a) coating the substrate with a layer of a polymer which can complex with a noble metal compound,
    (b) contacting the layer of polymer with a noble metal compound selected from the group consisting of palladium (II) chloride, palladium (II) sulfate, and palladium (II) acetylacetonate to form a complexed polymer,
    (c) drying the complexed polymer,
    (d) selectively irradiating the complexed polymer in a predetermined pattern,
    (e) applying a chemical etch to the complexed polymer so that the irradiated portions of the complexed polymer etch at a slower rate than the non-irradiated portions of the complexed polymer,
    (f) removing the chemical etch and etched complexed polymer from the substrate wherein the complexed polymer remaining on the substrate corresponds to the predetermined pattern, and (g) placing the complexed polymer remaining on the substrate in an electroless plating bath from the group consisting of copper, nickel and gold so that the desired conductor pattern is formed in the predetermined pattern.

9. The process in claim 8 wherein prior to step (a) the substrate surface is cleaned.

10. The process in claim 8 wherein the polymer is selected from the group consisting of poly (acrylic acid) and polyacrylamid.

11. The process in claim 8 wherein the source of irradiation is a laser beam.

12. The process in claim 8 wherein the etchant is selected from the group consisting of KOH and NaOH.

13. A process for the selective deposition of a conductor on a substrate comprising the following steps in the sequence set forth:
(a) immersing the substrate in a solution of a polymer which can complex with a noble metal compound,
(b) selectively irradiating the immersed substrate in a predetermined pattern so that the polymer is selectively deposited on the substrate where localized heating occurs corresponding to the predetermined pattern,
(c) removing the non-deposited polymer solution from the substrate,
(d) contacting the deposited polymer with a noble metal compound to form a complexed deposited polymer, and
(e) placing the complexed deposited polymer remaining on the substrate in an electroless plating bath so that the desired conductor pattern is formed in the predetermined pattern.

14. The process in claim 13 wherein prior to step (a) the substrate surface is cleaned.

15. The process in claim 13 wherein the polymer is selected from the group consisting of poly (acrylic acid) and polyacrylamid.

16. The process in claim 13 wherein the noble metal compound is selected from the group consisting of palladium (II) chloride, palladium (II) sulfate, and palladium (II) acetylacetonate.

17. The process in claim 13 wherein the source of irradiation is a laser beam.

18. The process in claim 13 wherein the electroless plating bath is used to plate a metal selected from the group consisting of copper, nickel, and gold.

19. A process for the selective deposition of a conductor on a substrate comprising the following steps in the order set forth:
(a) immersing the substrate in a solution of a polymer which can complex with a noble metal compound,
(b) selectively irradiating the immersed substrate in a predetermined pattern so that the polymer is selectively deposited on the substrate where localized heating occurs corresponding to the predetermined pattern,
(c) removing the non-deposited polymer solution from the substrate,
(d) contacting the deposited polymer with a noble metal compound selected from the group consisting of palladium (II) chloride, palladium (II) sulfate, and palladium (II) acetylacetonate to form a complexed deposited polymer, and
(e) placing the complexed deposited polymer remaining on the substrate in an electroless plating bath from the group consisting of copper, nickel and gold so that the desired conductor pattern is formed in the predetermined pattern.

20. The process in claim 19 wherein prior to step (a) the substrate surface is cleaned.

21. The process in claim 19 wherein the polymer is selected from the group consisting of poly (acrylic acid) and polyacrylamid.

22. The process in claim 19 wherein the source of irradiation is a laser beam.

23. A process for the selective deposition of a conductor on a substrate comprising the following steps in the sequence set forth:
(a) coating the substrate with a layer of a polymer-noble metal compound mixture, wherein said mixture forms a complexed polymer,
(b) drying the complexed polymer,
(c) selectively irradiating the complexed polymer in a predetermined pattern.
(d) applying a chemical etch to the complexed polymer so that the irradiated portions of the complexed polymer etch at a slower rate than the non-irradiated portions of the complexed polymer,
(e) removing the chemical etch and the etched complexed polymer from the substrate wherein the complexed polymer remaining on the substrate corresponds to the predetermined pattern, and
(f) placing the complexed polymer remaining on the substrate in an electroless plating bath so that the desired conductor pattern is formed in the predetermined pattern.

24. The process in claim 23 wherein prior to step (a) the substrate surface is cleaned.

25. The process in claim 23 wherein the polymer is selected from the group consisting of poly (acrylic acid) and polyacrylamid.

26. The process in claim 23 wherein the noble metal compounds is selected from the group consisting of palladium (II) chloride, palladium (II) sulfate, and palladium (II) acetylacetonate.

27. The process in claim 23 wherein the source of irradiation is a laser beam.

28. The process in claim 23 wherein the etchant is selected from the group consisting of KOH and NaOH.

29. The process in claim 23 wherein the electroless plating bath is used to plate a metal selected from the group consisting of copper, nickel, and gold.

30. A process for the selective deposition of a conductor on a substrate comprising the following steps in the sequence set forth:
(a) coating the substrate with a mixture of a polymer and a noble metal compound, wherein said noble metal compound is selected from the group consisting of palladium (II) chloride, palladium (II) sulfate, and palladium (II) acetylacetonate, wherein said mixture forms a complexed polymer,
(b) drying the complexed polymer,
(c) selectively irradiating the complexed polymer in a predetermined pattern,
(d) applying a chemical etch to the complexed polymer so that the irradiated portions of the complexed polymer etch at a slower rate than the non-irradiated portions of the complexed polymer,
(e) removing the chemical etch and the etched complexed polymer from the substrate wherein the complexed polymer remaining on the substrate corresponds to the predetermined pattern, and
(f) placing the complexed polymer remaining on the substrate in an electroless plating bath from the group consisting of copper, nickel and gold so that the desired conductor pattern is formed in the predetermined pattern.

31. The process in claim 30 wherein prior to step (a) the substrate surface is cleaned.

32. The process in claim 30 wherein the polymer is selected from the group consisting of poly (acrylic acid) and polyacrylamid.

33. The process in claim 30 wherein the source of irradiation is a laser beam.

34. The process in claim 30 wherein the etchant is selected from the group consisting of KOH and NaOH.

* * * * *

UNITED STATES PATENT OFFICE
CERTIFICATE OF CORRECTION

Page 1 of 2

Patent No. 4,981,715                           Dated  Jan. 1, 1991

Inventor(s)  Hirsch et al

It is certified that error appears in the above-identified patent and that said Letters Patent is hereby corrected as shown below:

Column 1, line 8, insert -- the terms of contract No. J-FBI-89-103 awarded by -- after "by".

Column 1, line 68, change "SOurce" to -- source --

Column 3, line 7, change "teChniques" to -- techniques --

Column 5, line 5, change "this second" to -- the first --

Column 5, line 5, change "one" to -- two --

Column 5, line 24, change "poly (acrylic acid)" to -- poly(acrylic acid) --

Column 6, line 34, change "poly (acrylic acid)" to -- poly(acrylic acid) --

Column 6, line 43, change "HaOH" to --NaOH --

Column 7, line 9, change "poly (acrylic acid)" to -- poly(acrylic acid) --

Column 7, line 37, change "poly (acrylic acid)" to -- poly(acrylic acid) --

Column 8, line 6, change "poly (acrylic acid)" to -- poly(acrylic acid) --

Column 8, line 18, change "." to -- , --

Column 8, line 34, change "poly (acrylic acid)" to -- poly(acrylic acid) --

UNITED STATES PATENT AND TRADEMARK OFFICE
CERTIFICATE OF CORRECTION

PATENT NO. : 4,981,715

DATED : Jan. 1, 1991

INVENTOR(S) : Hirsch et al

It is certified that error appears in the above-identified patent and that said Letters Patent is hereby corrected as shown below:

Column 10, line 1, change "poly (acrylic acid)" to -- poly(acrylic acid) --

Signed and Sealed this

Thirtieth Day of April, 1991

Attest:

HARRY F. MANBECK, JR.

Attesting Officer

Commissioner of Patents and Trademarks